(12) United States Patent
Koyata et al.

(10) Patent No.: US 7,338,904 B2
(45) Date of Patent: Mar. 4, 2008

(54) METHOD FOR MANUFACTURING SINGLE-SIDE MIRROR SURFACE WAFER

(75) Inventors: Sakae Koyata, Tokyo (JP); Tadashi Denda, Tokyo (JP); Masashi Norimoto, Tokyo (JP); Kazushige Takaishi, Tokyo (JP)

(73) Assignee: SUMCO Corporation, Tokyo (JP)

( * ) Notice: Subject to any disclaimer, the term of this patent is extended or adjusted under 35 U.S.C. 154(b) by 0 days.

(21) Appl. No.: 10/596,177

(22) PCT Filed: Dec. 3, 2004

(86) PCT No.: PCT/JP2004/018067

§ 371 (c)(1),
(2), (4) Date: Aug. 17, 2006

(87) PCT Pub. No.: WO2005/055302

PCT Pub. Date: Jun. 16, 2005

(65) Prior Publication Data

US 2007/0158308 A1 Jul. 12, 2007

(30) Foreign Application Priority Data

Dec. 5, 2003 (JP) ............................. 2003-408222

(51) Int. Cl.
*H01L 21/302* (2006.01)
(52) U.S. Cl. .................. 438/692; 438/693; 438/745; 134/1.1
(58) Field of Classification Search ............... 438/691, 438/692, 693, 745, 747; 134/1.2, 1.3
See application file for complete search history.

(56) References Cited

U.S. PATENT DOCUMENTS

| 5,899,731 | A | 5/1999 | Kai et al. |
| 5,963,821 | A | 10/1999 | Kai et al. |
| 6,043,156 | A | 3/2000 | Kai et al. |
| 2002/0016072 | A1* | 2/2002 | Hashii et al. ............... 438/690 |
| 2003/0104698 | A1 | 6/2003 | Taniguchi et al. |
| 2003/0171075 | A1* | 9/2003 | Nihonmatsu et al. ......... 451/41 |

FOREIGN PATENT DOCUMENTS

| JP | 10-092777 | 4/1998 |
| JP | 10-135164 | 5/1998 |
| JP | 10-135165 | 5/1998 |
| JP | 2002-025950 | 1/2002 |
| JP | 2002-203823 | 7/2002 |
| JP | 2003-077875 | 3/2003 |
| JP | 2003-100701 | 4/2003 |
| JP | 2003-203890 | 7/2003 |

OTHER PUBLICATIONS

English Language Abstract of JP 2003-077875.
English Language Abstract of JP 2003-203890.
English Language Abstract of JP 2003-100701.

* cited by examiner

*Primary Examiner*—Lan Vinh
(74) *Attorney, Agent, or Firm*—Greenblum & Bernstein, P.L.C.

(57) ABSTRACT

A surface of a semiconductor wafer which has been lapped is ground. This removes a damage caused on the wafer surface during lapping, thereby increasing the flatness of the wafer surface. Next, the wafer is subjected to composite etching and the both surfaces are polished, i.e., subjected to mirror polishing while the wafer rear surface is slightly polished so as to obtain a single-side mirror surface wafer having a difference between the front and the rear surfaces. As compared to mere acid etching or alkali etching, it is possible to manufacture a single-side mirror surface wafer having a higher flatness.

3 Claims, 9 Drawing Sheets

METHOD FOR MANUFACTURING SINGLE-SIDE MIRROR SURFACE WAFER

FIELD OF THE INVENTION

The present invention relates to a method for manufacturing a single-side mirror surface wafer, and more specifically to a method for manufacturing a single-side mirror surface wafer having improved flatness and distinguishable difference between a top and a back surfaces.

DESCRIPTION OF THE PRIOR ART

In the manufacture of silicon wafers, typically an ingot is sliced to produce a silicon wafer, which is in turn subject to a series of processing consisting of chamfering, lapping, acid etching and mirror polishing that are performed sequentially.

In the acid etching process, the silicon wafer that has just finished with the lapping process is typically dipped in a diffusion rate control type of mixed acid having a higher etching rate, specifically the mixed acid containing $HF/HNO_3$ as a main ingredient, so as to remove any strain developed in the lapping and the chamfering processes. Advantageously, the acid etching is highly reactive with the silicon wafer and thus has a higher etching rate. In the acid etching, however, a large number of air bubbles is generated from a surface of the wafer during the etching, leading to an undulation with a pitch of about 10 mm and a height of several tens to several hundred nm generated on both the top and the back surfaces of the silicon wafer. This consequently results in decreased flatness or degradation of nano-topography of the wafer surface.

In this regard, in a photo-lithography process among others in the device processing, such a phenomenon would be observed, when the silicon wafer is sucked on a wafer retainer plate, that the undulation present in the back surface of the wafer could be transferred onto the top surface of the wafer which has been already processed to be a mirror finished surface via the polishing process. This would adversely reduce the resolution in exposure, leading to a low device yield.

There is a known method in the prior art to address this problem, including, for example, "Method for manufacturing a semiconductor wafer" as disclosed in a cited reference, Patent Document 1.

This prior art method has made a modification, in which alkali etching by using an alkaline etching solution is introduced instead of the acid etching as previously practiced for the etching of the silicon wafer after having finished with the lapping process. This can resolve the problem of undulation associated with the acid etching. In addition, the method has employed, instead of the conventionally practiced mirror polishing, double side polishing for providing a mirror polishing on the top surface of the wafer, while at the same time, providing a light polishing onto an unevenness that has emerged in the back surface of the wafer during the etching process. In addition, the method includes a step of grinding process for grinding the top surface of the silicon wafer at some time between the alkali etching process as described above and the double side polishing process. Advantageously, this allows the top surface of the wafer to have less roughness and rather high flatness before the starting of the double side polishing process, while enabling a volume removed by polishing in the double side polishing process to be reduced. According to the alkali etching, both the top and the back surfaces of the silicon wafer could develop the uneven region extending in a longitudinal and lateral directions by a range of about 10 μm to 20 μm with a difference of about 2 μm between the highest and the lowest points therein. Thus developed uneven region has been typically removed by the polishing in the conventional manner.

[Patent Document 1]

Japanese Patent Laid-open Publication No. 2002-25950

SUMMERY OF THE INVENTION

Problem to be Solved by the Invention

However, in any of the methods for manufacturing a single-side mirror surface wafer including the method disclosed in the cited Patent Document 1 according to the prior art, the etching process is only provided by either one of the acid etching or the alkali etching. Consequently, the etching in such a manner is associated with the problems as described above including the undulation in the top and the back surfaces of the wafer resultant from the acid etching in one hand and the uneven region in the top and the back surfaces of the wafer resultant from the alkali etching in the other hand. Those problems have been an obstacle blocking the way to the achievement of a single-side mirror surface wafer having further improved flatness.

An object of the present invention is to provide a method for manufacturing a single-side mirror surface wafer having improved flatness and distinguishable difference between top and back surfaces of the wafer.

Means to Solve the Problem

A first invention provides a method for manufacturing a single-side mirror surface wafer, comprising: a grinding step for grinding a top surface of a semiconductor wafer after its having been lapped; an etching step for etching the ground semiconductor wafer; and a double side polishing step for mirror polishing the top surface of the etched semiconductor wafer, while at the same time polishing lightly a back surface of the etched semiconductor wafer, wherein said etching step comprises a composite etching including an acid etching and an alkali etching which are performed in a predetermined sequence.

According to the first invention, the top surface of the lapped semiconductor wafer is ground. This step of processing can remove any processing damages formed on the top surface of the wafer during the lapping process, thereby increasing the flatness of the top surface of the wafer. The flatness of the top surface of the wafer as after its having been etched substantially depends on the flatness of the top surface of the wafer as immediately before the etching process. This is because the etching proceeds along both the top and back surfaces of the wafer to dissolve the semiconductor.

Subsequently, the composite etching is performed on the semiconductor wafer, which provides the acid etching and the alkali etching in a predetermined sequence. After that, the double side polishing is performed on the semiconductor wafer so as to mirror polish the top surface of the wafer, while at the same time applying a light polishing onto the back surface of the wafer. The series of those steps provides a single-side mirror surface wafer having distinguishable difference between the top and the back surfaces.

As described above, since the etching process in the present invention has been provided as the composite etching for applying the acid etching and the alkali etching in the predetermined sequence, therefore the method of the present invention can produce the single-side mirror surface wafer having a top surface of improved flatness over the semiconductor wafer simply processed with either one of the acid etching or the alkali etching.

The semiconductor wafer may employ a silicon wafer, a gallium arsenide wafer and the like, for example.

The single-side mirror surface wafer refers to such a semiconductor wafer having one side (top surface) thereof, on which devices are to be formed, mirror finished by polishing.

The grinding step may provide for the grinding process with a reduced damage to the top surface of the semiconductor wafer after having been lapped. The grinding performed herein may include only the finishing grinding or a combination of a primary grinding intended to grind the top surface of the semiconductor wafer to be relatively rough with said finishing grinding. Further, a secondary or a tertiary grinding on the semiconductor wafer may also be performed at some time between the primary grinding and the finishing grinding.

A volume ground off from the semiconductor wafer is in a range of 10 to 20 µm. A grinding wheel incorporated in a finishing grinding machine may use a resinoid grinding wheel or a metal bonded grinding wheel, for example. It is to be reminded in this regard that preferably a grinding wheel of high grading number should be employed in the finishing grinding process, which hardly roughen the top surface of the semiconductor wafer and is capable of grinding even a surface without damage. Specifically, the grinding wheel may employ the resinoid grinding wheel classified with its grading number from #1000 to #8000, preferably the resinoid grinding wheel with the grading number from #2000 to #4000.

A grinding machine used herein may employ the one comprising a lower platen and a grinding head located above the lower platen, for example. The semiconductor wafer may be placed securely on an upper surface of the lower platen via vacuum suction, for example. In one example, an annular grinding wheel is fixedly attached to a lower surface of the grinding head along an outer periphery thereof. The grinding wheel may employ the one including a plurality of grinding chips made of resinoid grinding stone arranged in the annular configuration.

In this grinding operation, a revolution speed of the lower platen may be in a range of 30 rpm to 50 rpm and a revolution speed of the polishing head may be in a range of 5000 rpm to 7000 rpm. A grinding solution may employ ultrapure water. A volume to be ground off may be in a range of 10 µm to 20 µm. A thickness of work damage layer (grinding scar) appearing on the wafer surface during grinding may be in a range of 1 µm to 3 µm. The thicker the damage layer is, the more volume is required to be removed by polishing from the wafer surface during the subsequent double side polishing process.

The term "etching" used herein refers to the wet etching. The wet etching includes the acid etching and the alkali etching. The acid etching may use, HF, HNO$_3$, CH$_3$COOH, H$_2$O$_2$, a mixed acid solution of phosphoric acid, for example. Further, the alkali etching may use an alkaline etching solution of NaOH, KOH, or ammonia, for example.

A volume to be removed by etching is in a range of 10 µm to 15 µm per one side of the semiconductor wafer. The etching volume smaller than 10 µm could not remove the strain completely, which has been produced during the mechanical processing. In contrast, the etching volume greater than 15 µm may lead to deteriorated or unsatisfied flatness of the wafer surface.

The etching may be performed by using an etching bath. The etching bath may be of single wafer processing type capable of processing the semiconductor wafers on the one-by-one basis. Alternatively, a batch processing type of etching bath for processing a plurality of semiconductor wafers in a batch may be used.

A material used to make the etching bath may employ a material having chemical resistance against the etching solution, including silica glass, Pyrex (registered trademark) glass, polypropylene, PTFE and PFA, for example. A configuration and a size of the etching bath are not limited. For example, the configuration of the etching bath may include a rectangular bath and a round bath. The size of the etching bath of batch processing type has to be large enough to accommodate a wafer cassette for the semiconductor wafers of largest gauge.

The semiconductor wafer is etched while being rotated around a centerline of the wafer. For example, a plurality of semiconductor wafers as housed in the wafer cassette is rotated around. This rotation of the semiconductor wafers can make a uniform etching volume across the surfaces of the wafers. A rotation speed may be in a range of 5 rpm to 50 rpm, for example.

A retaining structure of the wafer cassette is not limited. For example, such a structure may be employed, in which lower end portions of legs located in opposite sides of the wafer cassette are locked. An alternative structure may be employed, in which central portions or upper portions of the legs located in opposite sides of the wafer cassette are locked. The term "locked" used herein refers to a locked state via a locking system by way of engagement between a concave part and a convex part and via a clamping system by way of gripping means, for example.

The number of rotational members to be used is not limited. One or two or more members may be used.

A structure of a means for rotating the wafer is not limited. The structure requires at least a rotational member and a driver for deriving the rotational member.

A material used to make the wafer cassette and the rotational member is not limited. The material having the chemical resistance against the etching solution in use may be appropriately selected. For example, in case of the alkaline etching solution to be used, a synthetic resin having alkaline resistance may be employed, including polytetrafluoroethylene (the product name, Teflon (registered trademark) manufactured by Dupont) and polyporpylene, for example.

A double side polishing machine used in the polishing operation may employ a planetary gear type double side polishing machine having a sun gear, or a no-sun gear type double side polishing machine having no sun gear, for example. The planetary gear type double side polishing machine is a double side polishing machine of planetary gear type comprising a sun gear of small diameter and an internal gear of larger diameter disposed with their axis lines aligned with each other between an upper platen and a lower platen arranged in the parallel relationship, in which an external gear of a carrier plate having a wafer holding hole formed therethrough for holding the semiconductor wafer is engaged with the sun gear and the internal gear of the polishing machine, respectively.

Besides, in the no-sun gear type double side polishing machine, a carrier plate is driven to make a circular motion in a plane parallel with a surface of the carrier plate without rotating on its own axis between an upper platen affixed with a polishing cloth and a lower platen affixed with a polishing cloth, in a condition where the semiconductor wafer is held in the wafer holding hole of the carried plate, while a polishing agent being supplied over the wafer. The term "circular motion without rotating on its own axis" refers to such a circular motion that the carrier plate is turning while keeping constantly a position eccentric from an axis of revolution of the upper and lower platens by a predetermined distance. This circular motion allows every point on the carrier plate to trace an identical size of small circle.

The number of wafer holding hole formed through the carrier plate may be one (in the single wafer processing type) or two or more. A size of the wafer holding hole may be varied as desired depending on each specific size of the semiconductor wafer to be polished.

A type and a material of the polishing cloth may not be limited. For example, the polishing cloth may be a non-woven fabric pad made of non-woven fabric with urethane resin impregnated and hardened, a pad of urethane foam made by slicing a block of urethane foam and the like. Other types of polishing cloth may be employed, including a suede pad comprising a base material made of polyester felt impregnated with polyurethane, which has been further processed so that layers of polyurethane foam are deposited over the top surface of the base material and then the top layer of the polyurethane is removed to form a resultant opening in the foam layer.

The polishing agent may employ the one comprising an alkaline etching solution having a pH value in a range of 9 to 11 containing colloidal silica abrasive grains having an average grain size in a range of 0.1 µm to 0.02 µm dispersed in the solution. Alternatively, an acidic etching solution containing the abrasive grains dispersed in the solution may be employed. An amount of the polishing agent to be supplied may vary in dependence on the size of semiconductor wafer and the like. In one example, the agent may be supplied at a flow rate of 1.0 litter to 2.0 litter/min.

In the polishing operation by the planetary gear type double side polishing machine, the carrier plate is disposed between the sun gear and the internal gear such that the carrier plate can rotate on its own axis and also can rotate around the sun, and the upper and the lower platens with the polishing cloth affixed to their opposing surfaces are pressed against the semiconductor wafer held in the wafer holding hole of the carrier plate so as to be in sliding contact therewith, to thereby polish the both sides (the top and the back surfaces) of the semiconductor wafer at the same time.

Besides, in the polishing operation by the no-sun gear type double side polishing machine, the semiconductor wafer is held between the upper platen and the lower platen, and while keeping this condition, the carrier plate is driven to make a circular motion without rotating on its own axis, to thereby providing the double side polishing. According to the circular motion without rotating on its own axis, every point on the carrier plate can make exactly the same motion. This can be considered a type of oscillating movement. That is to say, the trailing of the oscillating movement can draw a circle. Such a motion of the carrier plate allows the semiconductor wafer to be polished, while being revolved within the wafer holding hole, during the polishing process.

"Poising lightly a back surface of the semiconductor wafer" means that the uneven region emerged in the back surface of the semiconductor wafer by the alkali etching is polished lightly to remove a part thereof and to thereby control the glossiness of the back surface of the wafer. A volume to be removed by polishing in the double side polishing operation is in a range of 6 µm to 10 µm for the top surface (the mirror surface) of the wafer and in a range of 2 µm to 6 µm for the back surface of the wafer. A thickness of the work damage layer left in the top side of the wafer after the polishing process is in a range of 5 µm to 10 µm, and it is in a range of 10 µm to 20 µm in the back side of the wafer. Thus, with the volume to be removed by polishing determined in a range of 6 µm to 10 µm for the top surface and in a range of 2 µm to 6 µm for the back surface of the wafer, it becomes possible to distinguish the top surface from the back surface of the semiconductor wafer based on their specific intensity (glossiness) measured by the photo sensor. The glossiness of the back surface of the wafer is no higher than 200% (390% or higher for the mirror surface) as determined via a measurement of glossiness by a glossmeter manufactured by Nippon Denshoku.

A method used to process the top surface of the semiconductor wafer to be a mirror surface and simultaneously process the back surface of the semiconductor wafer to be a semi-mirror polished surface by using the double side polishing machine is not limited. It maybe contemplated in one exemplary method that the polishing rate on the top surface of the wafer by the polishing cloth for the top surface of the wafer is differentiated from the polishing rate on the back surface of the wafer by the polishing cloth for the back surface of the wafer.

The sequence for applying the acid etching and the alkali etching to the semiconductor wafer is not limited. In addition, the number of times of application of the acid etching and the alkali etching is not limited, either. Preferably, the rinsing process with ultrapure water may be performed immediately after the acid etching and the alkali etching, respectively.

A second invention provides a method for manufacturing a single-side mirror surface wafer as defined in the first invention, wherein in said composite etching, any of the following etching procedures maybe applied to the semiconductor wafer: (1) After the acid etching having been applied to the semiconductor wafer, the alkali etching is applied to said semiconductor wafer; (2) After a first acid etching with a first acidic etching solution having been applied to the semiconductor wafer, a second acid etching using a second acidic etching solution is firstly applied to said semiconductor wafer and then the alkali etching is applied to said semiconductor wafer; (3) After the alkali etching having been applied to the semiconductor wafer, the acid etching is applied to said semiconductor wafer; or (4) After a first acid etching with a first acidic etching solution having been applied to the semiconductor wafer, the alkali etching is firstly applied to said semiconductor wafer and then a second acid etching using a second acidic etching solution is applied to said semiconductor wafer.

According to the second invention, in case (1) where after the acid etching having been applied to the semiconductor wafer, the alkali etching is applied to said semiconductor wafer, the acid etching facilitates the control of shaping of the outer periphery of the semiconductor wafer, thus advantageously helps improve the flatness of the single-side mirror surface wafer.

In case (2) where after a first acid etching with a first acidic etching solution having been applied to the semiconductor wafer, a second acid etching using a second acidic etching solution is firstly applied to said semiconductor wafer and then the alkali etching is applied to said semiconductor wafer, the acid etching facilitates the control of shaping of the outer periphery of the semiconductor wafer, thus advantageously helps improve the flatness of the single-side mirror surface wafer. In addition, more advantageously, the volume to be removed by etching in the acid etching process can be increased without deteriorating the flatness of the semiconductor wafer after the lapping process, with the aid of the acid etching process that is provided in two independent acid etching steps, thereby reducing the roughness of the surface of the single-side mirror surface wafer.

In case (3) where after the alkali etching having been applied to the semiconductor wafer, the acid etching is applied to said semiconductor wafer, the roughness of the surface of the wafer can be significantly reduced when the ratio of the volume to be removed by the alkali etching to that by the acid etching is 3:2. There is a work damage layer (the deteriorated layer caused by the mechanical processing) resultant from the machining, such as the lapping and grinding, present in the surface of the semiconductor wafer. The work damage layer includes individual portions having the magnitude (significance) of damage different from each other, wherein more seriously damaged portions are selectively etched by taking advantage of anisotropic effect (selectivity) of the alkali etching. This conditions the surface of the semiconductor wafer to be smoother "to some degree", and in combination with or following to the alkali etching, the acid etching characterized by its higher isotropic effect is applied, which can help reduce the surface roughness of the semiconductor wafer significantly.

In case of (4) where after a first acid etching with a first acidic etching solution having been applied to the semiconductor wafer, the alkali etching is firstly applied to said semiconductor wafer and then a second acid etching using a second acidic etching solution is applied to said semiconductor wafer, the profit from both the acid etching and the alkali etching can be obtained. In addition, since the second acid etching is applied to the semiconductor wafer after its having been finished with the alkali etching, therefore a cleaning effect can be provided to remove any metal impurities that have adhered to the semiconductor wafer during the alkali etching.

For the case (1), a volume to be removed by etching from the semiconductor wafer in the acid etching may be equal to or less than 15 μm and that in the alkali etching may be in a range of 10 μm to 15 μm. For the case (2), a volume to be removed by etching from the semiconductor wafer in the first acid etching and in the second acid etching may be equal to or less than 20 μm, respectively, and that in the alkali etching may be in a range of 5 μm to 10 μm. Further, for the case (3), a volume to be removed by etching from the semiconductor wafer in the alkali etching may be equal to or less than 15 μm and that in the acid etching may be equal to or less than 20 μm. Still further, for the case (4), a volume to be removed by etching from the semiconductor wafer in the first acid etching and the subsequent alkali etching may be equal to or less than 10 μm and that in the second acid etching may be equal to or less than 5 μm.

The first etching solution and the second etching solution used in each composite etching process in the case (2) and the case (4) may be different in composition, concentration and the like.

EFFECT OF THE INVENTION

According to the first invention, since the present invention has employed the procedure for the double side polishing process comprising the steps of mirror polishing the top surface of the wafer while at the same time polishing lightly the back surface of the wafer, along with the composite etching procedure for the etching process including the acid etching and the alkali etching, which are performed in the predetermined sequence, therefore the improved one-side mirror surface wafer can be produced which has the distinguishable difference between the top and the back surfaces of the wafer and the improved flatness over the case according to the prior art where either one of the acid etching or the alkali etching is applied to the semiconductor wafer. Further, since the present invention has employed the double side polishing for the polishing process, therefore the procedure of polishing can be simplified by polishing the both sides of the wafer at the same time.

Particularly according to the second invention, in the case (1) where after the acid etching having been applied to the semiconductor wafer, the alkali etching is applied to said semiconductor wafer, the acid etching facilitates the control of shaping of the outer periphery of the semiconductor wafer, thus advantageously helps improve the flatness of the single-side mirror surface wafer.

In the case (2) where after a first acid etching having been applied to the semiconductor wafer, a second acid etching using a different acidic etching solution is applied to said semiconductor wafer and then the alkali etching is applied to said semiconductor wafer, the acid etching facilitates the control of shaping of the outer periphery of the semiconductor wafer, thus advantageously helps improve the flatness of the single-side mirror surface wafer. In addition, more advantageously, the volume to be removed by etching in the acid etching process can be increased without deteriorating the flatness of the semiconductor wafer after the lapping process, with the aid of the acid etching process that is provided in two independent acid etching steps, thereby reducing the roughness of the surface of the single-side mirror surface wafer.

In the case (3) where after the alkali etching having been applied to the semiconductor wafer, the acid etching is applied to said semiconductor wafer, the roughness of the surface of the wafer can be reduced significantly when the ratio of the volume to be removed by the alkali etching to that by the acid etching is 3:2.

In the case of (4) where after a first acid etching having been applied to the semiconductor wafer, the alkali etching is applied to said semiconductor wafer and then a second acid etching using a different acidic etching solution is applied to said semiconductor wafer, the profit from both the acid etching and the alkali etching can be obtained. In addition, since the second acid etching is applied to the semiconductor wafer after its having been finished with the alkali etching, therefore a cleaning effect can be also provided to remove any metal impurities that have adhered to the semiconductor wafer during the alkali etching.

DESCRIPTION OF REFERENCE NUMERAL

10: No-sun gear type double side polishing machine,
100; Planetary gear type double side polishing machine, and
W: Silicon wafer (semiconductor wafer)

DESCRIPTION OF THE PREFERRED EMBODIMENTS

Preferred embodiments of the present invention will now be described with reference to the attached drawings.

First Embodiment

Figure 1:
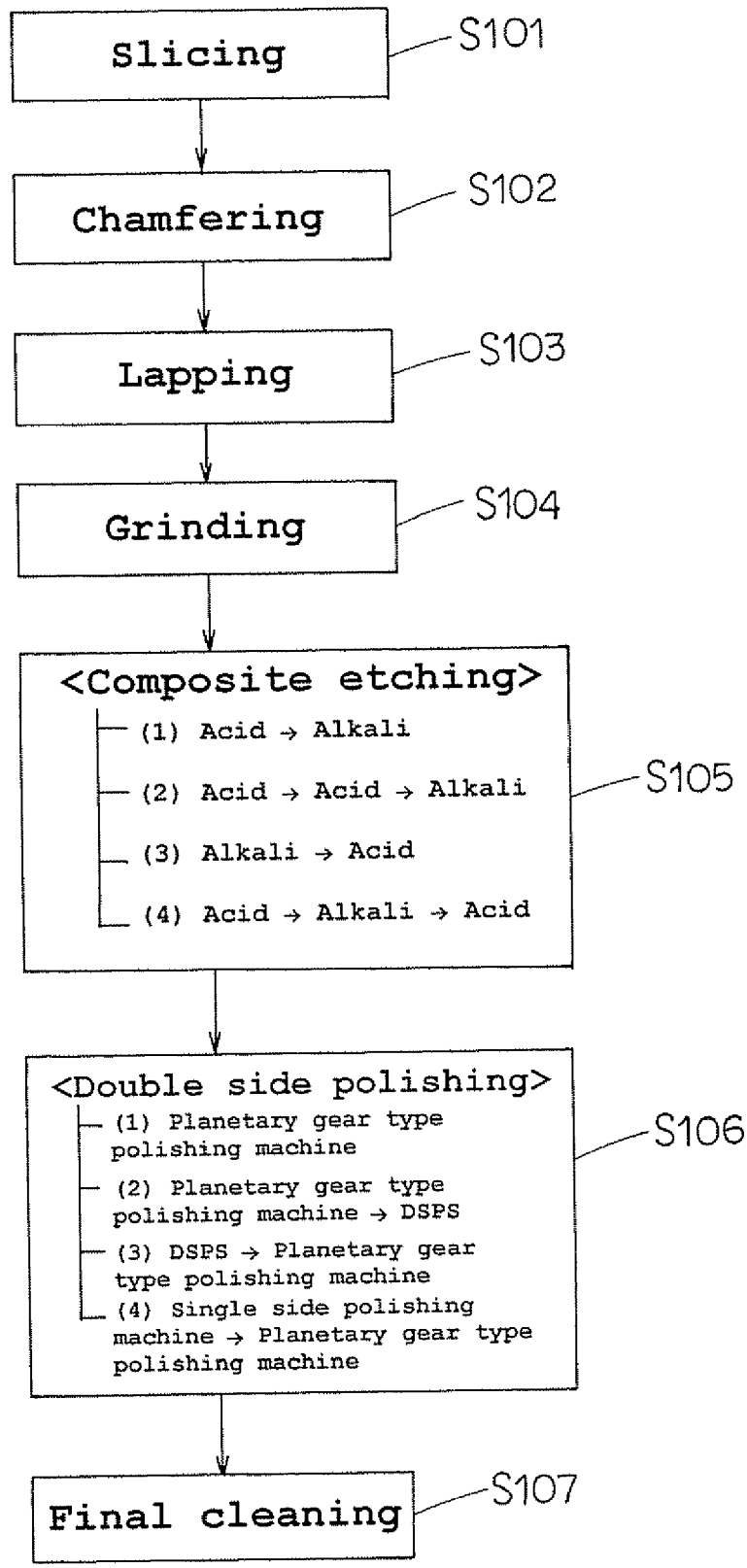
FIG. 1 is a flow sheet showing a method for manufacturing a single-side mirror surface wafer according to a first embodiment of the present invention.

Referring to FIG. 1, in a first embodiment, a single-side mirror surface wafer is manufactured via a series of processing including slicing, chamfering, lapping, grinding, composite etching, double side polishing and final cleaning. Respective steps of processing will now be described in detail.

An ingot of monocrystal silicon pulled-up in the CZ (Czochralski) method is sliced in the slicing step (S101) into silicon wafers (semiconductor wafers), each having a thickness of about 730 μm and a diameter of 300 mm.

The silicon wafer is then subject to the chamfering (S102). Specifically, an outer peripheral portion of the silicon wafer is chamfered roughly into a predetermined shape by using a metallic abrasive wheel for chamfering with the grading number of #600 to #1500. This forms the outer peripheral portion of the silicon wafer into a predetermined round contour (e.g., a chamfered configuration of MOS type).

Subsequently, the chamfered silicon wafer is lapped in the lapping step (S103). In the lapping step, the silicon wafer is placed between a pair of lapping platens arranged in the parallel relationship, and a lapping solution, or a mixture of alumina abrasive grains, a dispersing agent and water, is poured between the pair of lapping platens and the silicon wafer. Both lapping platens are then rotated under a predetermined pressure to cause a rubbing motion between the both lapping platens and the top and back surfaces of the silicon wafer for lapping the both sides of the wafer. A total volume to be removed by lapping for both the top and the back surfaces of the wafer is in a range of 40 μm to 80 μm.

Figure 2:
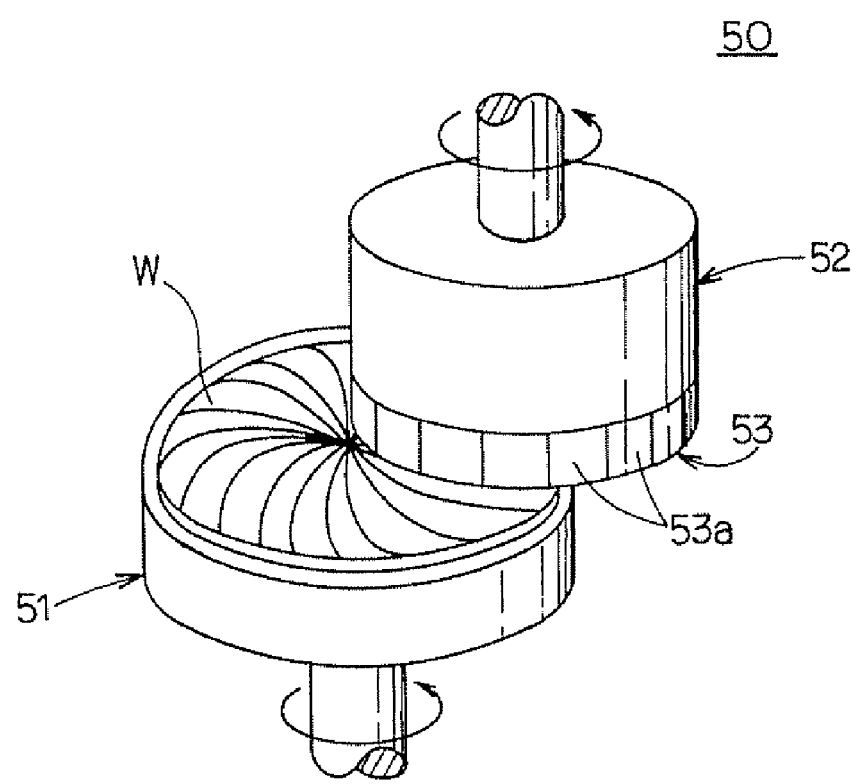
FIG. 2 is a perspective view of a grinding machine used in the method for manufacturing a single-side mirror surface wafer according to the first embodiment of the present invention.

Subsequently, the top surface of the lapped silicon wafer is grounded (S104) by using a surface grinding machine as shown in FIG. 2.

The surface grinding machine 50 comprises primarily a lower platen 51 and a grinding head 52 located above the lower platen 51. The silicon wafer W is chucked by vacuum onto an upper surface of the lower platen 51. An annular grinding wheel 53 is fixedly attached to an outer peripheral portion of a lower surface of the grinding head 52. The grinding wheel 53 is the annular wheel comprising a large number of grinding chips 53*a* made of resinoid grinding stone arranged in an annular configuration. A grading number of the abrasive grains of resinoid grinding stone is #4000. The grinding head 52 is lowered gradually at a rate of 0.3 μm/sec while rotating the grinding head at a rotation speed of 6000 rpm thereby to grind the top surface of the silicon wafer "W" mounted on the lower platen 51 with the grinding head 52. A rotation speed of the lower platen 51 during this operation is at 40 rpm.

Thus, the top surface of the silicon wafer W after having been lapped can be ground off to thereby remove any work damage in the wafer surface induced during the lapping process and to improve the flatness of the wafer surface.

A composite etching is then applied to the silicon wafer W after the grinding, where acid etching and alkali etching are applied to the wafer W in a predetermined sequence (S105). In this step, one of four types as listed below can be selected for the etching procedure. Specifically the silicon wafer may be subject to: (1) acid etching followed by alkali etching; (2) first acid etching followed by second acid etching using a different type of acidic etching solution and then alkali etching; (3) alkali etching followed by acid etching; or (4) first acid etching followed by alkali etching and then second acid etching using a different type of acidic etching solution.

Figure 3:
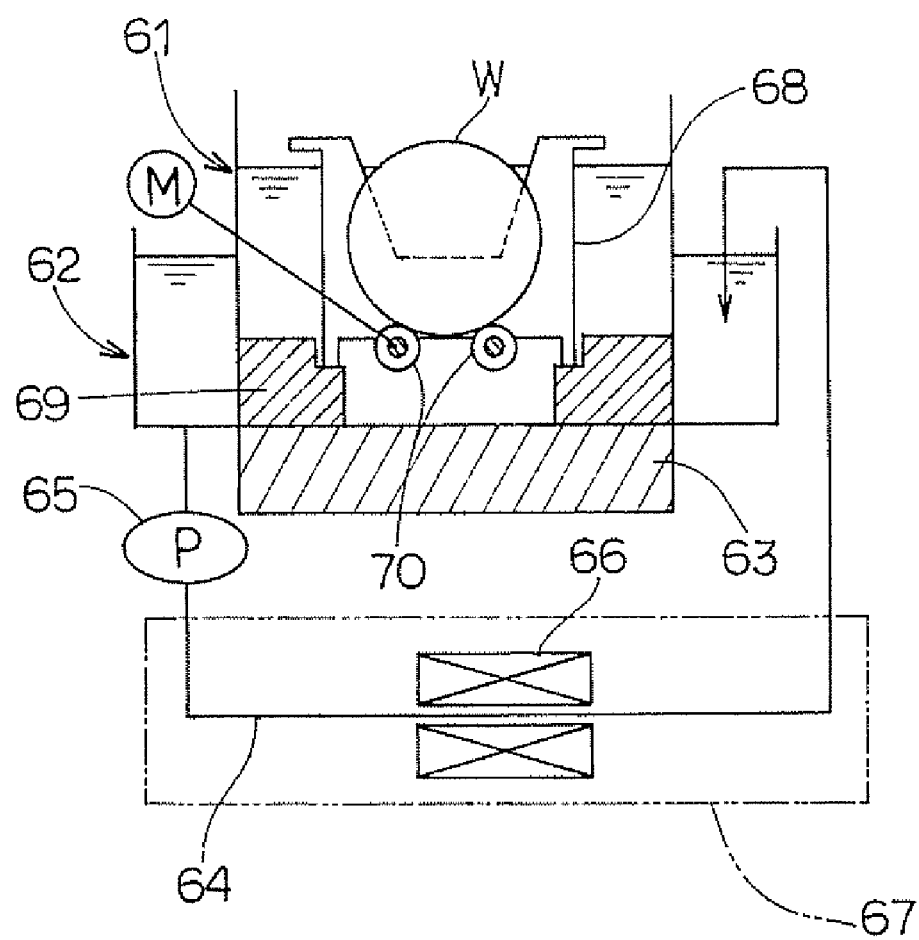
FIG. 3 is a longitudinal sectional view of an etching system used in the method for manufacturing a single-side mirror surface wafer according to the first embodiment of the present invention.

The description is first directed to an etching system. Referring to FIG. 3, an etching system according to the first embodiment is generally shown by reference numeral 60. Two units of etching system 60 may be used for the acid etching and the alkali etching to be applied independently to the silicon wafer W. Each unit of etching system 60 comprises a rectangular etching bath 61, a pair of cassette holding elements spaced apart from each other in a bottom portion of the etching bath 61 for holding a wafer cassette 68 containing a plurality of silicon wafers W, a pair of revolving shaft 70, 70 disposed between the pair of cassette holding elements 69 for rotating the respective silicon wafers contained in the wafer cassette 68 around respective centerlines within a vertical plane, a rotary motor M for rotating one of the revolving shafts 70 around its axis line, a jacket 62 surrounding entirely peripheral side walls of the etching bath 61 for storing hot pure water (a heating medium) used to rise a temperature of an etching solution in the bath indirectly, an ultrasonic oscillator 63 disposed under the bottom surface of the etching bath 61 for indirectly stirring the etching solution in the bath, a heat transfer medium circulation path 64 coupled (in communication) with the jacket 62 in both ends of the path and serving for once introducing the hot pure water to a point away from the etching bath 61 and then returning the hot pure water back to the jacket 62, a circulation pump 65 for the hot pure water disposed in the heat transfer medium circulation path 64, and an electric heater (means for rising a temperature) 66 disposed externally at an intermediate location in the heat transfer medium circulation path 64 away from the etching bath 61 for rising the temperature of the hot pure water flowing through the heat transfer medium circulation path 64.

The etching bath 61 is made of Teflon (registered trade mark), a product name, having chemical resistance against both an acidic etching solution and an alkaline etching solution. Interior volumetric capacity of the etching bath 61 is defined as 20 litters. The wafer cassette 68 loaded with a plurality of silicon wafers W is inserted through an opening of the etching bath 61 to be dipped into the etching solution.

The jacket 62 as described above is a bath made of Teflon (registered trade mark) having a donut-like configuration in plan view. The jacket 62 is open in the top. The bottom surface of the jacket is coupled with one end of the heat transfer medium circulation path 64. The heat transfer medium circulation path 64 comprises a tubular member made of PPA having an overall length of about 3 m.

The circulation pump 65 is a pressure pump for force-feeding the hot pure water at a rate of 15 litter/min and located in the vicinity of one end of the jacket 62.

The electric heater 66 is disposed at a location on the heat transfer medium circulation path 64 spaced away from the etching bath 61 by a distance of 1 m. It is to be noted that an atmosphere in a space where the electric heater 66 is installed is blocked by an isolation wall 67 from an atmosphere of the etching bath 61.

Subsequently, the wafer cassette 68 loaded with a plurality of silicon wafers W is dipped into the etching solution stored in the etching bath 61 in the etching process of the silicon wafers W in each unit of etching system 60, as shown in FIG. 3. Then, the acid etching or the alkali etching is applied to respective silicon wafers W with the etching solution kept at a predetermined temperature, while rotating respective silicon wafers W around the centerline of the wafers by the rotary motor M.

During the etching process, the etching solution is required to be kept at the predetermined temperature. To address this, hot pure wafer is circulated while continuously increasing the temperature thereof during the etching process. Specifically, the circulation pump 65 is activated so that the hot pure water in the jacket 62 may be introduced into the heat transfer medium circulation path 64 from the jacket 62. Then, the hot pure water introduced into the circulation path is heated by the electric heater 66 disposed in the intermediate location on the circulation path to a higher temperature and returned back to the jacket 62. The heat from the returned hot pure water can raise the temperature of the etching solution in the etching bath. Thus, the temperature of the etching solution can be held stable.

Specific operations in the composite etching process using the two units of etching system 60 will now be described. During the acid etching in the procedures (1) and (3) as well as the first acid etching in the procedures (2) and (4), a reaction rate control type of acidic etching solution of low etch rate, for example, a mixed acid containing $HF/HNO_3$ as a main ingredient (the first acidic etching solution) may be used. In addition, during the second acid etching in the procedures (2) and (4), a diffusion rate control type of acidic etching solution, for example, a mixed acid containing $HF/HNO_3$ as a main ingredient, a mixed acid containing $HF/HNO_3/CO_3COOR$ as a main ingredient or a mixed acid containing $HF/HNO_3$ as a main ingredient (the second etching solution) may be used. As for the alkaline etching solution, a NaOH solution having a concentration in a range of 45 wt % to 55 wt % may be used. In either case, the silicon wafers W are dipped in the etching solution at a predetermined temperature for a predetermined time.

For the procedure (1), a volume to be removed by etching may be in a range of 5 μm to 10 μm in the acid etching and in a range of 10 μm to 15 ηm in the alkali etching. For the procedure (2), a volume to be removed by etching may be in a range of 5 μm to 10 μm in the first acid etching, 5μm in the second acid etching and 10 μm in the alkali etching. For the procedure (3), a volume to be removed by etching may be 15 μm in the alkali etching and 10 μm in the acid etching. For the procedure (4), a volume to be removed by etching may be in a range of 5 μm to 10 μm in the first acid etching, 10 μm in the alkali etching and 5 μm in the second acid etching.

Thus, since in the illustrated embodiment, the silicon wafer W is subject to (1) the acid etching followed by the alkali etching, therefore the control to the circumferential contour of the silicon wafer W can be facilitated with the aid of the acid etching, which advantageously contributes to the improved flatness of the single-side mirror surface wafer. Further, since the silicon wafer W is subject to (2) the first acid etching followed by the second acid etching and then the alkali etching, therefore the control to the circumferential contour of the silicon wafer W can be facilitated with the aid of the acid etching, which advantageously contributes to the improved flatness of the single-side mirror surface wafer. Still advantageously, the acid etching performed in two independent steps can help increase the volume to be removed by the acid etching so as to reduce the surface roughness yet without deteriorating the flatness of the silicon wafer W after the lapping step.

Yet further, for the case of the silicon wafer W subject to (3) the alkali etching followed by the acid etching, the roughness of the surface of the silicon wafer W can be reduced significantly when the ratio of the volume to be removed by the alkali etching to that by the acid etching is 3:2.

For the case of the silicon wafer W subject to (4) the first acid etching followed by the alkali etching and then the second acid etching, the profit from both the acid etching and the alkali etching can be obtained. Further, since the silicon wafer W is subject to the acid etching after the alkali etching, therefore advantageously a cleaning effect can be also provided to remove any metal impurities that have adhered to the silicon water w during the alkali etching.

Since the first embodiment has employed the composite etching for the etching step comprising in combination the acid etching and the alkali etching which are applied to the silicon wafer W in a predetermined sequence, it becomes possible to manufacture a single-side mirror surface wafer having the improved flatness over the case of the silicon wafer W simply applied with either one of the acid etching or the alkali etching.

In next step, after the composite etching, the silicon wafer W is then subject to a double side polishing (S106). This step may also select either one of the following four different procedures. To explain this specifically, the silicon wafer W may be subject to either one of the followings: (1) The top surface of the silicon wafer W is polished off by 8 µm and simultaneously the back surface of the silicon wafer W is polished off by 4 µm; (2) Both the top and the back surfaces of the silicon wafer W are polished off by 4 µm respectively by using a planetary gear type double side polishing machine having a sun gear and then the top surface of the silicon wafer W is polished off by 4 µm by using a no-sun gear type double side polishing machine; (3) The top surface of the silicon wafer W is polished off by 4 µm by using a no-sun gear type double side polishing machine and then both the top and the back surfaces of the silicon wafer W are polished off by 4 µm respectively by using the planetary gear type double side polishing machine; or (4) The top surface of the silicon wafer W is polished off by 4 µm by using a single side polishing machine then both the top and the back surfaces of the silicon wafer W are polished off by 4 µm respectively. Since the embodiment has employed the double side polishing as the polishing step, therefore the polishing step can be simplified with the aid of the both side concurrent processing. This double side polishing is advantageous to the achievement of the higher level (ultra-high level) of flatness of the silicon wafer W. It is a matter of course that the silicon wafer after each step of etching may be subject to the cleaning with pure water.

Three types of polishing machine to be used in the double side polishing step will be described below.

Figure 4:
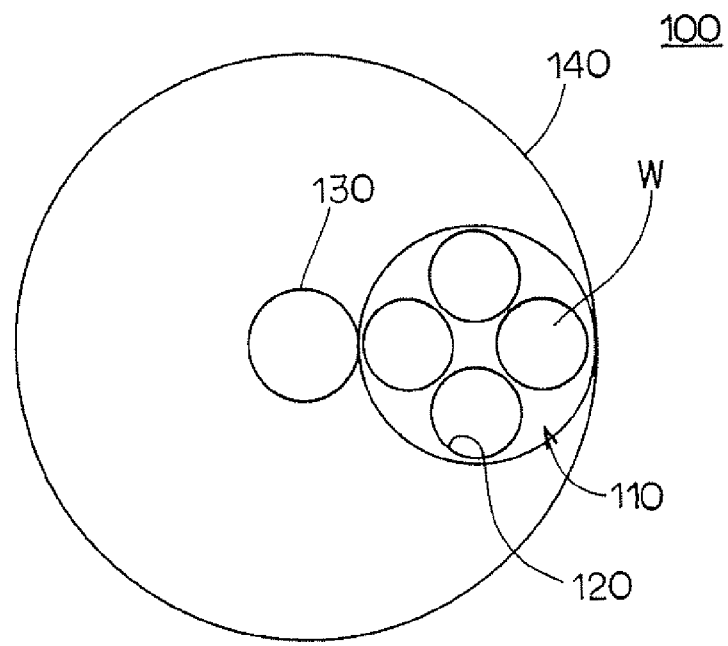
FIG. 4 is a plan view of main components of a planetary gear type double side polishing machine used in the method for manufacturing a single-side mirror surface wafer according to the first embodiment of the present invention.
Figure 5:
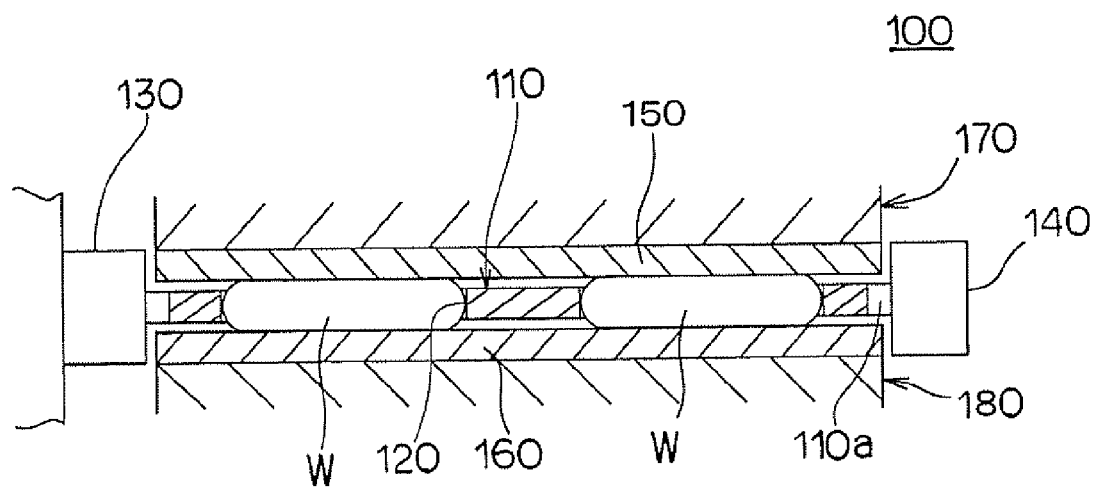
FIG. 5 is an enlarged sectional view of main components of the planetary gear type double side polishing machine used in the method for manufacturing a single-side mirror surface wafer according to the first embodiment of the present invention.

Referring now to FIGS. 4 and 5, the planetary gear type double side polishing machine will be described. In FIGS. 4 and 5, reference numeral 100 generally designates a planetary gear type double side polishing machine. According to the planetary gear type double side polishing machine 100, silicon wafers W are placed and held in a plurality of wafer holding holes 120 formed through a carrier plate 110, where each one of the wafers W is polished in its both sides at the same time while supplying a polishing fluid containing abrasive grains over the wafer W from the above thereof.

Specifically, at first, the carrier plate 110 having an external gear 110a along a circumference thereof is arranged between a sun gear 130 and an internal gear 140, both capable of rotating, so that the carrier plate 110 can rotate on its own axis and also around the sun gear 130. Then, an upper platen 170 and a lower platen 180 affixed with a top surface side polishing cloth 150 and a back surface side polishing cloth 160, respectively, in the opposing surfaces thereof are vertically pressed against and into a sliding contact with the top and the back surfaces (the upper surface and the lower surface) of the silicon wafer W held in the carrier plate 110, so that the silicon wafer W can be polished in both sides at the same time.

The top surface side polishing cloth 150 serving for polishing the top surface (mirror surface) of the silicon wafer W has employed a polishing cloth having a higher ability for retaining a polishing agent than the lower surface side polishing cloth 160, so that the resultant polishing rate in the top surface of the silicon wafer w would be higher than the polishing rate in the back surface (semi-mirror surface) of the silicon wafer W by the back surface side polishing cloth 160. Since the top surface side polishing cloth 150 and the back surface side polishing cloth 160 have employed the polishing cloth made of different types of material which provide different ability for retaining a polishing agent and consequently different resultant polishing rate from each other, therefore the top surface of the wafer can be mirror surface finished, while the back surface of the wafer tends to hardly be a mirror surface, during the double side polishing.

Indeed, the glossiness of the top and the back surfaces of the silicon wafer was measured after the double side polishing by the planetary gear type double side polishing machine 100, where the result showed the measured glossiness of 200% in average (390% or higher defined as a mirror surface) for the back surface of the wafer after the double side polishing in the measurement of glossiness by using a glossmeter manufactured by Nippon Denshoku. In contrast, the measured glossiness of the top surface of the wafer was 390% in average. Further, the flatness achieved in the top surface of the silicon wafer W was, in average value, 0.2 µm or lower by SBIR and 0.5 µm or lower by GBIR.

Turning now to FIGS. 6 to 13, the no-sun gear type double side polishing machine (DSPS) will be described below.

Figure 6:
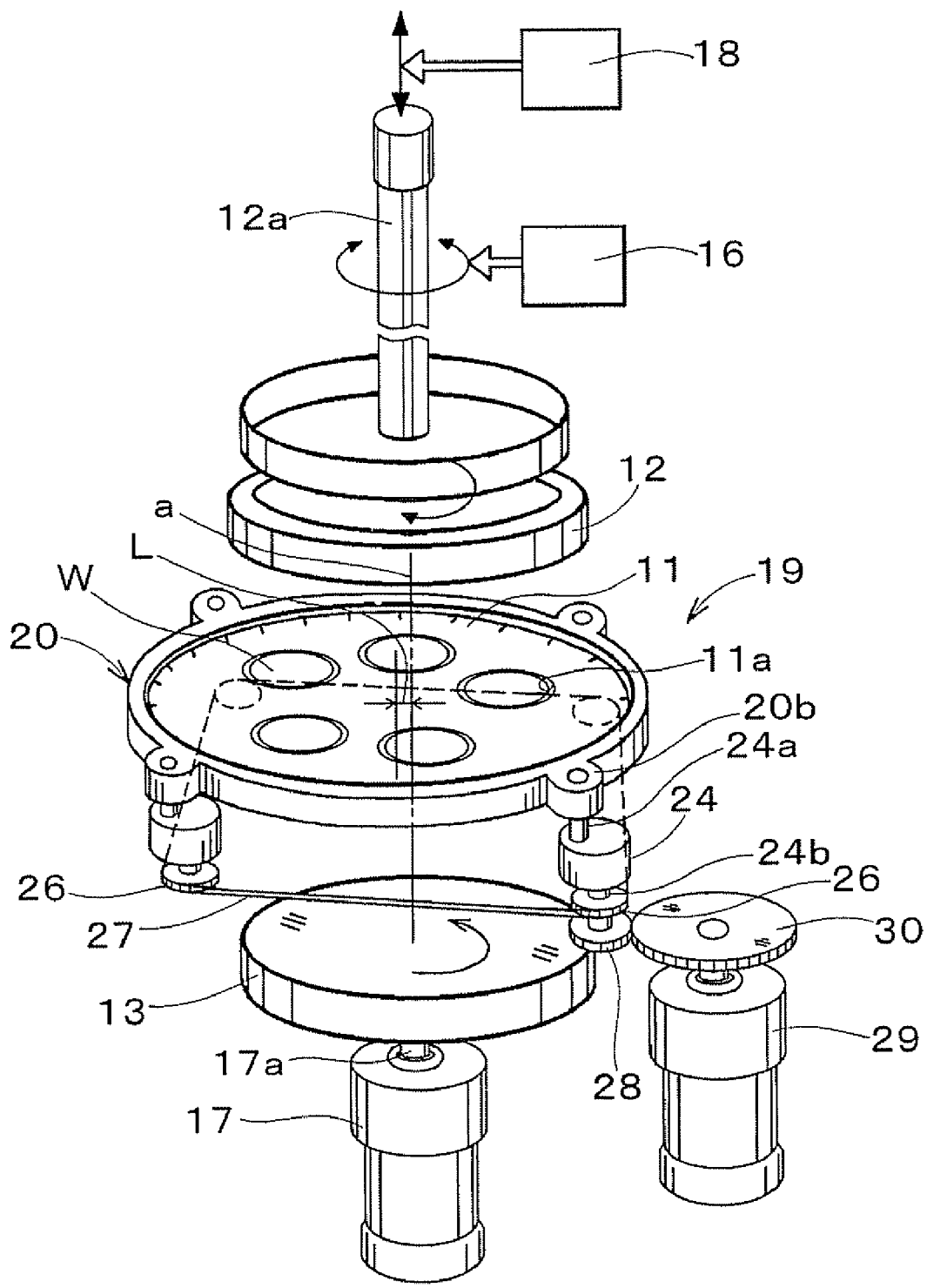
FIG. 6 is an exploded perspective view of an entire unit of a no-sun gear type double side polishing machine used in the method for manufacturing a single-side mirror surface wafer according to the first embodiment of the present invention.
Figure 7:
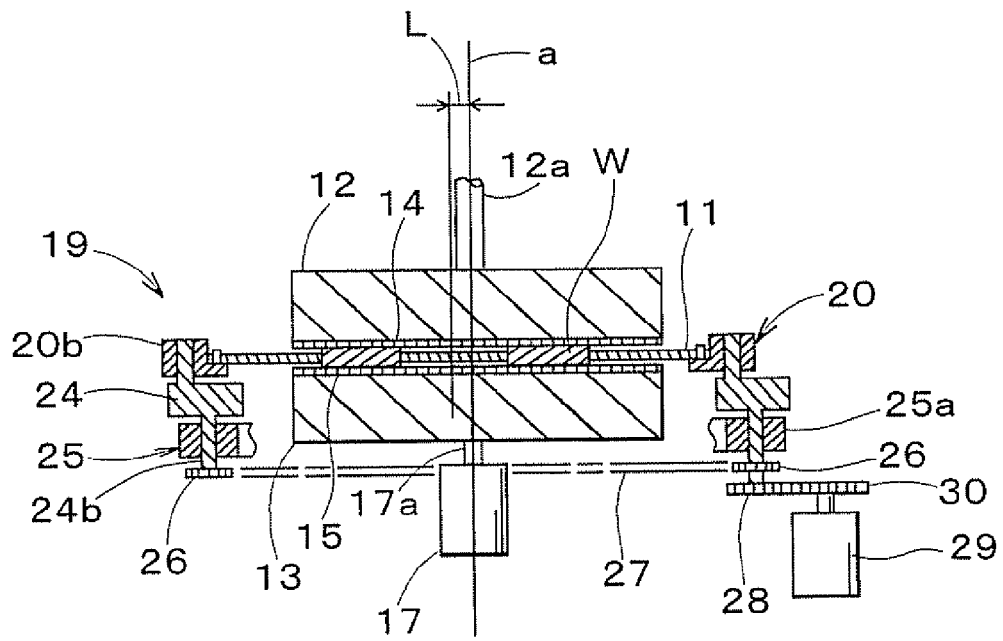
FIG. 7 is a longitudinal sectional view of the no-sun gear type double side polishing machine according to the first embodiment of the present invention, illustrating its operation in double side polishing of a wafer.

In FIGS. 6 and 7, reference numeral 10 generally designates a no-sun gear type double side polishing machine. Specifically, the illustrated embodiment has employed a double side polishing machine (LPD300) manufactured by Fujikoshi Co., Ltd.

The no-sun gear type double side polishing machine 10 comprises a carrier plate 11 having five wafer holding holes 11a formed therethrough by every 72° (circumferentially) around an axis line of the plate, and an upper platen 12 and a lower platen 13 operable for cramping the silicon wafers W, which have been placed and rotatably held in respective wafer holding holes 11a of the carrier plate 11, vertically from above and below and also for polishing the wafer surfaces by moving relative to the silicon wafer W. A diameter of the silicon wafer W is 300 mm. The carrier plate 11 is made of glass epoxy having a disc-like shape in plan view, and the thickness (600 µm) of the carrier plate 11 is a little thinner than the thickness of the silicon wafer W (730 µm).

Figure 8:
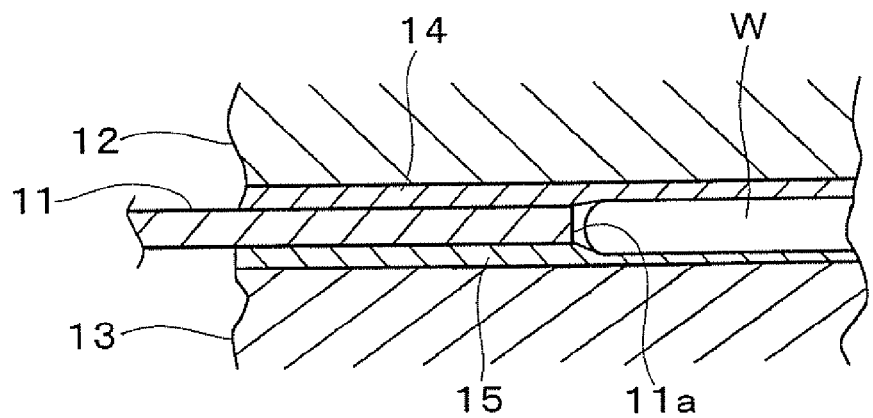
FIG. 8 is an enlarged sectional view of main components of the no-sun gear type double side polishing machine illustrating its operation in double side polishing.

As shown in FIG. 8, a lower surface of the upper platen 12 is affixed with a back surface side polishing cloth 14, Bellatrix VN573, serving for polishing the back surface of the silicon wafer W. Further, an upper surface of the lower platen 13 is affixed with a top surface side polishing cloth 15, SUBA800, serving for polishing the top surface of the silicon wafer W into a mirror surface.

Regarding both the top and the back surface side polishing clothes 14 and 15, if mentioning the ability for retaining the polishing agent containing abrasive grains, it is a matter of course that the top surface side polishing cloth 15, or a soft cloth, has a higher ability for retaining the polishing agent over the back surface side polishing cloth 14, or a stiff cloth. The higher the ability for retaining the polishing agent is, the more the amount of abrasive grains adhering to the polishing surface is and thus the greater the polishing rate of the silicon wafer W is.

As shown in FIGS. 6 and 7, the upper platen 12 is rotated in a horizontal plane by an upper rotary motor 16 via a revolving shaft 12a extending upward from the upper platen 12. Further, the upper platen 12 is moved up and down vertically by an elevator device 18, which causes the upper platen 12 to be advanced or retracted along the axial direction. The elevator device 1B is used to feed/eject the silicon wafer W to/from the carrier plate 11. It is to be noted that the pressure applied onto the silicon wafer W from above and below (to the top and the back surfaces of the wafer) by the upper platen 12 and the lower platen 13 may be controlled by a pressure means such as air bags which are not shown but incorporated in the upper platen 12 and the lower platen 13.

The lower platen 13 is rotated in a horizontal plane by a lower rotary motor 17 via its output shaft 17a. The carrier plate 11 is controlled to make a circular motion within a plane (a horizontal plane) parallel with the surface of the carrier plate 11 by a carrier circular motion mechanism 19 so as not to rotate on its own axis. With reference to FIGS. 6, 7, 10, 12 and 13, the carrier circular motion mechanism 19 will now be described in detail.

As seen from these drawings, the carrier circular motion mechanism 19 has an annular carrier holder 20 supporting the carrier plate 11 from outside. A device base 25 and the carrier holder 20 of the carrier circular motion mechanism 19 are coupled to each other via a coupling structure 21. The coupling structure 21 is a means for coupling the carrier plate 11 with the carrier holder 20 such that the carrier plate 11 is not allowed to rotate on its own axis but yet an expansion of the carrier plate 11 in the thermal expansion can be absorbed.

That is to say, the coupling structure 21 comprises a plurality of pins 23 protruding from an inner circumferential flange 20a of the carrier holder 20 at locations spaced by every predetermined angle along the circumference of the carrier holder 20, and a plurality of elongated pin holes 11b formed through the carrier plate 11 at corresponding locations in the outer peripheral portion of the carrier plate 11 with corresponding numbers to the plurality of pins 23.

The longitudinal direction of those pin holes 11b is in line with the radial direction of the plate 11 so as to allow the carrier plate 11 coupled to the carrier holder 20 via the pin 23 to move within a small range along the radial direction thereof. Mounting the carrier plate 11 to the carrier holder 20 with the pins 23 loosely fit in their corresponding pin holes 11b, respectively, allows for the absorption of any expansion of the carrier plate 11 in the radial direction due to the thermal expansion resultant from the heat associated with the polishing possibly generated during the double side polishing process. It is to be noted that a bottom portion (a lower portion) of each pin 23 is threaded. Respective pins 23 are screwed in tapped holes correspondingly formed in the inner circumferential flange 20a. Further, each of the pins 23 includes a flange 23a disposed around the pin 23 at a location immediately above the bottom portion with an external thread formed thereon, on which the carrier plate 11 is placed. Accordingly, the vertical level of the carrier plate 11 placed on the flange 23 can be adjusted by controlling the depth of screwing-in of the pin 23.

The carrier holder 20 includes four bearing sections 20b protruding outward at locations spaced by every 90° along the circumference of the carrier holder 20. An eccentric shaft 24a is inserted into each of the bearing sections 20b, which shaft 24a is protruding from an upper surface of a small disc-like eccentric arm 24 at an eccentric location thereof. Each of the four eccentric arms 24 further includes a rotary shaft 24b protruding downward at a central location of a lower surface of the arm 24. Each of the rotary shafts 24b is rotatably inserted into each one of four bearing sections 25a via a shaft hole arranged in the annular device base 25 spaced by every 90° along a circumference thereof. A tip portion of each rotary shaft 24b protrudes downward beyond the corresponding bearing section 25a and each protruded portion is fixedly attached with a sprocket 26. A timing chain 27 extends horizontally across respective sprockets 26. It is to be noted that the timing chain 27 may be replaced by a driving force transmission system of gear structure. A mechanism consisting of the four sprockets 26 and the timing chain 27 provides a synchronizing means for rotating the four rotary shafts 24b simultaneously so that the four eccentric arms 24 may make a circular motion synchronously.

One of the four rotary shafts 24b is extended longer than the others. The tip portion of the longer rotary shaft 24b extends downward beyond the sprocket 26. The protruded portion is fixedly attached with a gear 28 serving for transmitting the driving force. The gear 28 is mated with a large driving gear 30 which is fixedly attached to an upward output shaft of a circular motion motor (e.g., a geared motor) 29. It is to be noted that the four eccentric arms 24 may not necessarily be rotated synchronously by the timing chain 27 but in one alternative example, the four eccentric arms 24 may be individually provided with the rotary motion motor 29 so as to drive and rotate the eccentric arms 24 independently. It is to be noted in this case that the revolution of the motor 29 requires to be synchronized among the four motors 29.

Thus, when the output shaft of the circular motion motor 29 starts to rotate, the torque is transmitted to the timing chain 27 via the gears 30, 28 and the sprocket 26 fixedly attached to the longer rotary shaft 24b to drive the timing chain 27 around the four sprockets. This causes the four eccentric arms 24 to rotate synchronously in the horizontal plane around their corresponding rotary shafts 24b via the other three sprockets 26. This in turn causes the carrier holder 20 entirely coupled with a set of four eccentric arms 24 and thus the carrier plate held in the charier holder 20 to make the circular motion in the horizontal plane in parallel with the carrier plate 11 without rotating on its own axis.

That is, the carrier plate 11 makes a circular motion as held to be eccentric away from an axial line Hall of the upper platen 12 and the lower platen 13 by a distance "L". The distance L is equal to a minimum distance between the eccentric shaft 24a and the rotary shaft 24b. This circular motion accompanied with no rotation on its own axis allows every point on the carrier plate 11 to trace an identical size of small circle.

Figure 12:
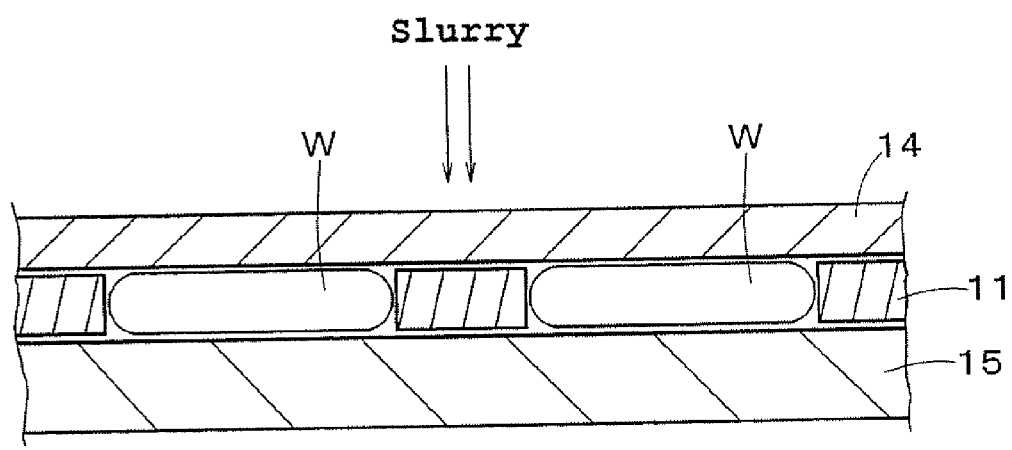
FIG. 12 is an enlarged sectional view of main components of the no-sun gear type double side polishing machine, illustrating a location of a polishing agent supply hole therein.
Figure 13:
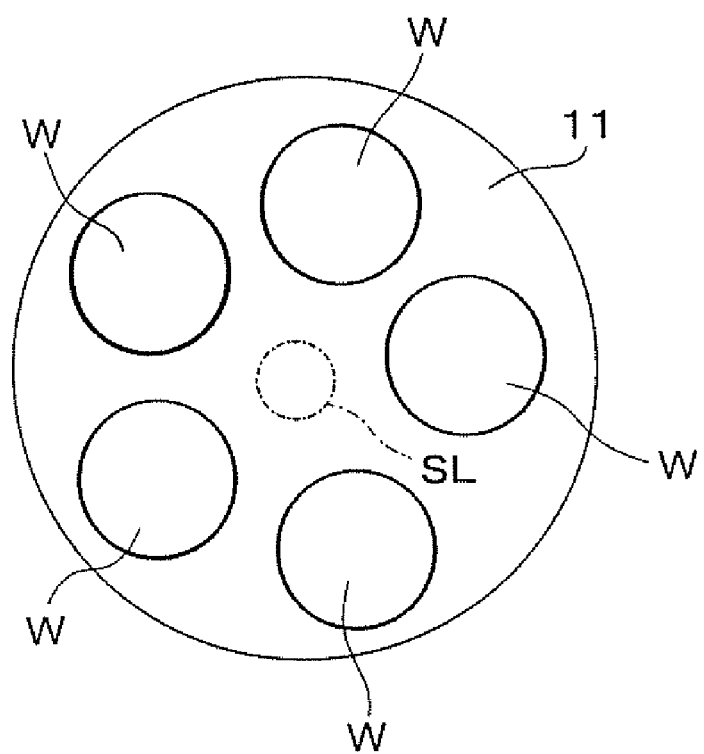
FIG. 13 is a plan view of main components of the no-sun gear type double side polishing machine, illustrating a location of the polishing agent supply hole therein.

Further, FIGS. 12 and 13 show a location of a polishing agent supply hole in the no-sun gear type double side polishing machine 10 For example, the location of a plurality of polishing agent supply holes formed in the upper platen 12 corresponds to the center of respective silicon wafers W. Specifically, the location of the plurality of polishing agent supply holes (SL) is defined in the central portion of the upper platen 2 or, in other words, above the central portion of the carrier plate 11. Consequently, a thin film provided by the polishing agent can be constantly maintained over the back surface of the silicon wafer W during the polishing.

A double side polishing method for a silicon wafer W by using the no-sun gear type double side polishing machine 10 will now be described.

Each of the silicon wafers W is inserted and rotatably held in each one of the wafer holding holes 11a of the carrier plate 11. In this connection, each wafer is held with its back surface up. Subsequently, as in this condition, the back surface side polishing cloth 14 rotating along with the upper platen 12 at 5 rpm is pressed against the back surfaces of respective silicon wafers W with a pressure 200 g/cm$^2$. In conjunction with this, the top surface side polishing cloth 15 rotating along with the lower platen 13 at 25 rpm is pressed against the top surfaces of respective silicon wafers W with a pressure of 200 g/cm$^2$.

After that, the timing chain 27 is driven by the circular motion motor 29 to rotate around four sprockets while holding the top and the back surface side polishing cloth 14, 15 pressed against the top and the back surfaces of the wafer, respectively and supplying the polishing agent from the upper platen 12 side at a flow rate of 2 litter/min. This causes the eccentric arms 24 to rotate synchronously in a horizontal plane, which in turn causes the respective carrier holders 20 coupled to corresponding eccentric shafts 24a respectively and thus the carrier plate 11 to make a circular motion in a plane parallel with the surface of the carrier plate 11 at 24 rpm without rotating on its own axis. Consequently, each of the silicon wafers W is held in the corresponding wafer holding hole 11a and makes a circular motion in a horizontal plane thereby allowing both the top and the back surfaces of each of the silicon wafers W to be polished at the same time. The polishing agent used herein is NA100 manufactured by Dupont. Specific composition thereof comprises a cyclic amine, an alcoholic amine and a surfactant.

In this regard, the back surface side polishing cloth 14 of the upper platen 12 is stiffer than the top surface side polishing cloth 15 of the lower platen 13. Owing to this, a volume of the silicon wafer W to be polished off is greater in the top surface than in the back surface of the wafer W. Consequently, the resultant top surface of the silicon wafer W is a mirror surface and the back surface of the silicon wafer W is a semi-mirror surface.

Figure 9:
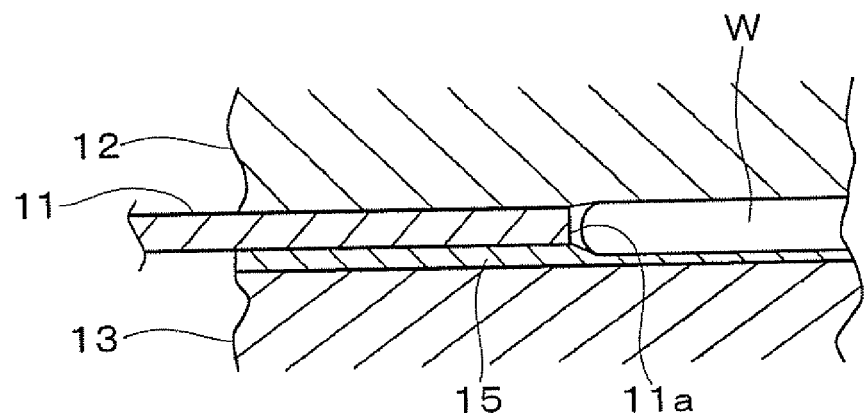
FIG. 9 is an enlarged sectional view of main components of the no-sun gear type double side polishing machine illustrating its operation in single side polishing.
Figure 10:
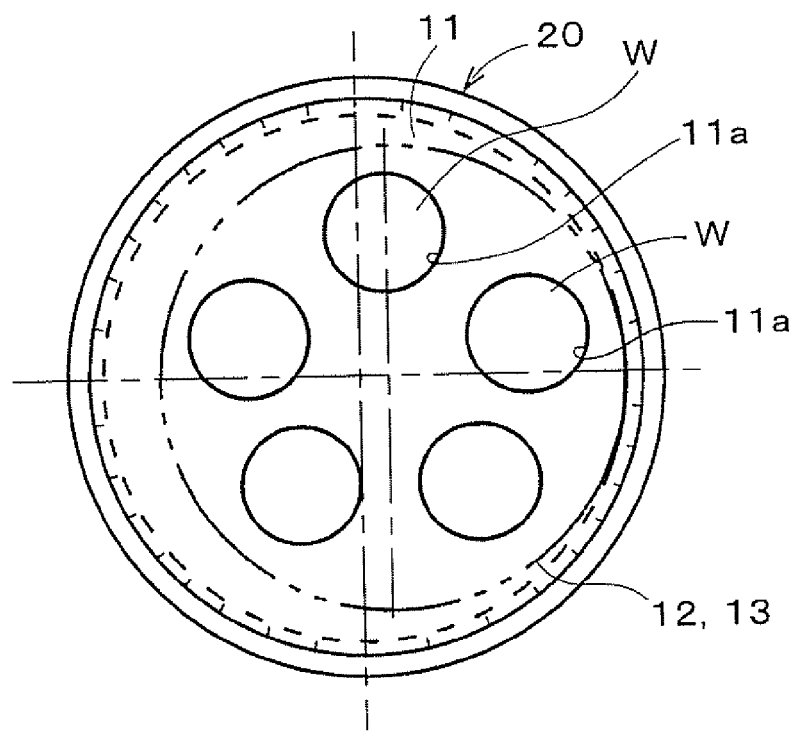
FIG. 10 is a schematic plan view of a no-sun gear type double side polishing machine.
Figure 11:
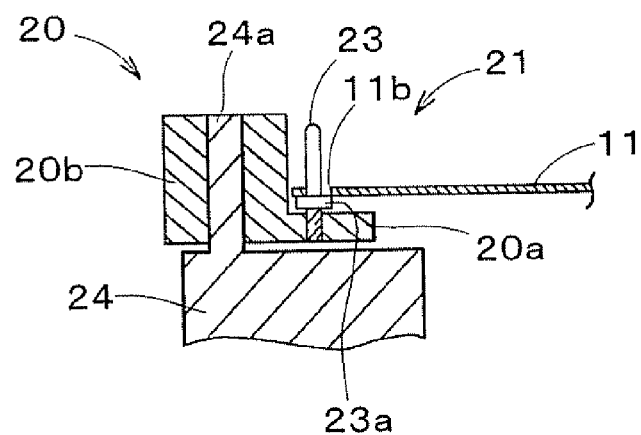
FIG. 11 is an enlarged sectional view of main components of a motion transfer system of the no-sun gear type double side polishing machine for transferring a kinetic force to a carrier plate.

In the single side polishing operation if performed by the no-sun gear type double side polishing machine 10, the back surface side polishing cloth 14 is detached from the upper platen 12 and the similar operation may be applied (FIG. 9).

A batch processing type of single side polishing machine will now be described, though not shown. This type of polishing machine comprises a polishing platen having an upper surface affixed with a polishing cloth for polishing the top surface of the silicon wafer and a polishing head disposed above the polishing platen and having a lower surface, to which a plurality of silicon wafer are affixed with an aid of wax via a carrier plate. During the polishing, the polishing platen may be rotated at a high speed. On the other hand, the polishing head may be rotated at a predetermined rotation speed. With this condition held as it is, a polishing agent is supplied over the polishing cloth at a predetermined flow rate and the top surface of the silicon wafer is pressed against the polishing cloth so as to be polished.

After that, the silicon wafer W is subject to the final cleaning step (S107) (FIG. 1). Specifically, the RCA cleaning may be applied.

According to the present invention, the surface of the silicon wafer which has bee lapped is ground. This can remove a work damage induced in the wafer surface during the lapping, thereby improving the flatness of the wafer surface. The composite etching is then applied to the silicon wafer W. Subsequently, the double side polishing is carried out so as to mirror polish the top surface of the wafer and at the same time to polish the back surface of the wafer lightly. This process can produce a resultant one-side mirror surface wafer having a distinguishable difference between the top and the back surfaces (the silicon wafer w having the top surface exclusively mirror finished).

As described above, since the present invention has employed the composite etching for the etching step comprising in combination acid etching and alkali etching which are performed on the silicon wafer W in a predetermined sequence, it becomes possible to manufacture a single-side mirror surface wafer having the improved flatness over the case of the silicon wafer W simply applied with either one of the acid etching or the alkali etching.

Indeed, the glossiness of the top and the back surfaces of the silicon wafer W was measured after the double side polishing by the no-sun gear planetary gear type double side polishing machine 10, and the result showed that substantially equivalent effect to that from the double side polishing of the silicon wafer W by the above-described planetary gear type double side polishing machine 100 had been obtained.

What is claimed is:

1. A method for manufacturing a single-side mirror surface wafer, comprising:
    grinding a top surface of a semiconductor after the top surface has been lapped;
    etching the ground semiconductor wafer; and
    mirror polishing the top surface of the etched semiconductor wafer, while simultaneously polishing lightly a back surface of the etched semiconductor wafer, wherein the top surface polishing of the semiconductor wafer is performed at a different speed than the back surface polishing of the semiconductor wafer, and wherein
    the etching of the semiconductor wafer comprises a first acid etching using a first acid etching solution on the semiconductor wafer, then a second acid etching using a second acid etching solution on the semiconductor wafer, and then alkali etching the semiconductor wafer.

2. A method for manufacturing a single-side mirror surface wafer, comprising:
    grinding a top surface of a semiconductor after the top surface has been lapped;
    etching the ground semiconductor wafer;
    mirror polishing the top surface of the etched semiconductor wafer, while simultaneously polishing lightly a back surface of the etched semiconductor wafer,
    wherein the top surface polishing of the semiconductor wafer is performed at a different speed than the back surface polishing of the semiconductor wafer,
    wherein the etching of the semiconductor wafer comprises an alkali etching on the semiconductor wager, then an acid etching on the semiconductor wafer; and
    wherein an amount of the alkali etching relative to an amount of the acid etching is in a ratio of 3:2.

3. A method for manufacturing a single-side mirror surface wafer, comprising:
    grinding a top surface of a semiconductor after the top surface has been lapped;
    etching the ground semiconductor wafer; and
    mirror polishing the top surface of the etched semiconductor wafer, while simultaneously polishing lightly a back surface of the etched semiconductor wafer,
    wherein the top surface polishing of the semiconductor wafer is performed at a different speed than the back surface polishing of the semiconductor wafer,
    wherein the etching of the semiconductor wafer comprises a first acid etching using a first acid etching solution on the semiconductor wafer, then alkali etching the semiconductor wafer, and then a second acid etching using a second acid etching solution on the semiconductor wafer.

* * * * *

UNITED STATES PATENT AND TRADEMARK OFFICE
CERTIFICATE OF CORRECTION

PATENT NO. : 7,338,904 B2 Page 1 of 1
APPLICATION NO. : 10/596177
DATED : March 4, 2008
INVENTOR(S) : Koyata et al.

It is certified that error appears in the above-identified patent and that said Letters Patent is hereby corrected as shown below:

At column 18, line 37, (claim 2, line 13) of the printed patent, change "wager" to --wafer--.

Signed and Sealed this

Fourth Day of November, 2008

JON W. DUDAS
*Director of the United States Patent and Trademark Office*